United States Patent

Ogawa

[11] Patent Number: 5,510,642
[45] Date of Patent: Apr. 23, 1996

[54] SEMICONDUCTOR DEVICE

[75] Inventor: Chihiro Ogawa, Tokyo, Japan

[73] Assignee: NEC Corporation, Tokyo, Japan

[21] Appl. No.: 357,321

[22] Filed: Dec. 16, 1994

[30] Foreign Application Priority Data

Dec. 16, 1993 [JP] Japan .................................. 5-317004

[51] Int. Cl.⁶ .................................................. H01L 29/76
[52] U.S. Cl. ........................ 257/380; 257/381; 257/516; 257/538; 257/581
[58] Field of Search .................................. 257/380, 381, 257/516, 538, 581

[56] References Cited

U.S. PATENT DOCUMENTS 5,352,923  10/1994  Boyd et al. ............................. 257/538

FOREIGN PATENT DOCUMENTS 1-214048  8/1989  Japan .
2-283058  11/1990  Japan .
4-199674  7/1992  Japan .

*Primary Examiner*—Edward Wojciechowicz
*Attorney, Agent, or Firm*—Popham, Haik, Schnobrich & Kaufman, Ltd.

[57] ABSTRACT

An insular shaped polycrystalline silicon film is formed by adhering its entire bottom face to the surface of a insulation film which is formed on the main face of a silicon substrate. A resistance element which contains designated impurities is formed in the central part of the polycrystalline silicon film. A non-doping region which essentially does not contain impurities and is adheres to all the sides of the resistance element, is positioned on the peripheral region except for the central part of the polycrystalline silicon film. By performing heat treatment when a non-doping amorphous silicon pattern is formed on the insulating film, the amorphous silicon pattern is convened to a non-doping polycrystalline silicon pattern. By using this method, a semiconductor device which has only small variances in its resistance value, which provides more efficient heat radiation, and which enables higher integration of a silicon substrate can be obtained.

4 Claims, 5 Drawing Sheets

SEMICONDUCTOR DEVICE

BACKGROUND OF THE INVENTION

1. Field of Invention

The present invention relates to a semiconductor device, especially to a resistance element.

2. Description of the Related Art

FIGS. 1 and 2 show a resistance element of prior art with FIG. 1 being its cross sectional view and FIG. 2 being its view from a slanting angle. A resistance element 27 is formed by patterning a polycrystalline silicon film 2 on a single crystal silicon substrate. The resistance element 27 comprises a resistor 20, whose resistance value is determined by its length L, width W and height (or thickness) T and the concentration of impurities, and contact regions 21 on both sides of the resistor.

FIGS. 3 and 4 show a resistance element of prior art with FIG. 3 being its cross sectional view and FIG. 4 being its top view. In a single crystal silicon substrate of first conduction type, a resistance element 37 of second conduction type is formed by diffusing impurities of second conduction type. The resistance element 37 comprises a resistor 30, whose resistance value is determined by its length L, width W and the concentration of impurities, and contact regions 31 on both side of the resistor.

Another resistance element of prior art as shown in FIG. 5 is disclosed in Japanese Unexamined Publication TOKKAI SHO 2-283058. In FIG. 5, a resistance element 47 is formed by patterning a non-doping polycrystalline silicon film grown by CVD method and introducing impurities into the area on an insulation film 2. The resistance element 47 comprises a resistor 40 and contact regions 41 on both side of the resistor. The contact region 41 and a non-doping region of the single crystal silicon film 42, which is formed gradually, are connected to the single crystal silicon substrate 1 in an opening 43 which is formed on the insulation film, so that the radiation can be improved by radiating to the single crystal silicon substrate through the non-doping region 42.

The resistance elements of the above mentioned FIGS. 1–5 have the following unsolved problems;

First, a resistance element shown in FIGS. 1 and 2 is formed on an insulation film, therefore, the degree of integration on the silicon substrate, where other elements are formed, can be improved. However, because the configuration of the resistance element 27 is formed by patterning the polycrystalline silicon film by etching, the resistance value is apt to largely vary depending on variance of the measurement due to etching. For example, when T is 200 μm and the width of the mask is 0.6 μm, W becomes 0.4 to 0.6 μm, making the resistance value vary ±20%. Furthermore, because the radiation routes of the heat generated at the resistor 20 in the resistance element 27 are the one to the wiring connected through the contact region 21 and the other through the insulation film 2 at the bottom side, the radiation is of problem.

In case of the resistance element shown in FIGS. 3 and 4, because the configuration of the resistance element can be formed by introducing impurities by using photoresist as a mask, the variance of the configuration is minimized and the same of the resistance value is also minimized. The radiation is also good in this structure. However, because it is formed in the silicon substrate where other elements are also formed, the improvement of the degree of integration of the silicon substrate is limited. Also, because the parasitic capacity due to a PN junction formed with the silicon substrate is large, hindrance for high speed operation is apt to occur. The insulation also become of problem.

In case of the resistance element shown in FIG. 5, although radiation can be improved, as the configuration of the resistance element, i.e. the configuration of the width direction is formed by selective etching, the variance of the resistance value is apt to become large as in the case of FIGS. 1 and 2. Also, improvement of the degree of integration of the silicon substrate is limited because it requires an opening 43 to have the substrate exposed. Furthermore, the polycrystalline silicon film is deposited by CVD method. Because the particle size of polycrystalline silicon by CVD method is so large as 0.01 to 0.05 μm that the resistance value varies greatly between before and after the activation heat treatment which takes place after the ion implantation of impurities. For example, the resistance value before and after the activation heat treatment varies by 50%, and the variance of the varied values is as large as 30%. Therefore, there is a defect that the final resistance value is difficult to pre-determine.

Another example of variation of the conventional manufacturing method of a semiconductor device shown in FIG. 5 is to form a resistance element by heat treatment of amorphous silicon formed by using the surface portion of the single crystal silicon exposed in the opening 43 as a seed. In the case of this method, because single crystal silicon develops in the opening 43, the amorphous silicon closer to the opening on the insulation film 2 is converted to single crystal silicon resulting in a state that the more polycrystalline silicon exists at the farther site from the opening. Therefore, because the particle size as a whole becomes larger, the problem of the variance of the values between before and after the heat treatment does not occur. However, the state of the crystallization varies depending on the distance from the opening 43. Because the resistance characteristic differs between the resistance element formed on single crystal silicon and the one formed on polycrystalline silicon, the factor of distance of the resistance element has to be taken into consideration when designing the arrangement, making the design very complex. Also, even if the method is modified as described above, the variation of the resistance value due to varied configuration in the width direction and the limitation on the degree of integration on the single crystal silicon substrate due to requirement for an opening remain as problems just as in FIG. 5.

SUMMARY OF THE INVENTION

The object of the present invention is to provide a semiconductor devise with smaller variance in resistance value, with improved radiation characteristics without causing parasitic capacity problem and with possibility of improving a degree of integration of a semiconductor substrate.

A semiconductor device according to the present invention comprises; a semiconductor substrate; an insulation layer which is formed on the main surface of said substrate; a polycrystalline silicon layer which is formed by overlapping its entire lower surface on the upper surface of said insulation layer; a resistance element with a predetermined impurity formed in the central part of said polycrystalline silicon layer; and a polycrystalline silicon region which is substantially non-doping with impurity and formed on all the sides of said resistance element, positioned on the peripheral region except for said central part of said polycrystalline silicon layer.

On the semiconductor device of the present invention, the non-doping polycrystalline silicon or amorphous silicon is preferred to be containing less than $1\times10^{14}$ atoms.cm$^{-3}$ of impurities, thus enabling the resistance rate to be more than $50\Omega$.cm and having the silicon be electrically an insulator and thermally a good conductor. Also, more than half the volume of the polycrystalline silicon is preferred to be occupied with crystal having diameter of more than 2 µm, thus making the variation of the resistance value between before and after the heat treatment negligibly small.

According to the semiconductor of the present invention, because the configuration of the resistance element can be formed by selectively introducing impurities by mask patterning, not by etching, the variance of the configuration of the resistance element can be minimized, which makes the variance of the resistance value also minimized. Also, the non-doping polycrystalline silicon region, on which radiation takes place, is formed continuously with the sides of the resistor of the resistance element, the heat generated in the resistor can be radiated efficiently. Furthermore, because all the bottom faces of the resistance element and the polycrystalline silicon film comprising non-doping region are adhering to the surface of the insulation film and the non-doping region for radiation is not connected with the silicon substrate, there is no hindrance for integration on the silicon substrate on which other elements are to be formed.

DETAILED DESCRIPTION OF THE PREFERRED EMBODIMENTS

Figure 1:
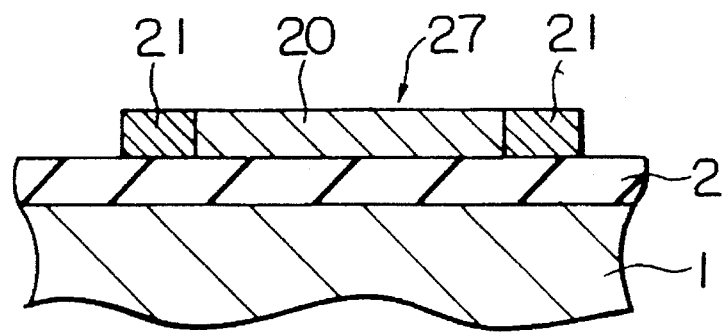
FIGS. 1 and FIG. 2 show a resistance element of prior art, with FIG. 1 being its cross sectional view and FIG. 2 being its view from slanting angle.
Figure 2:
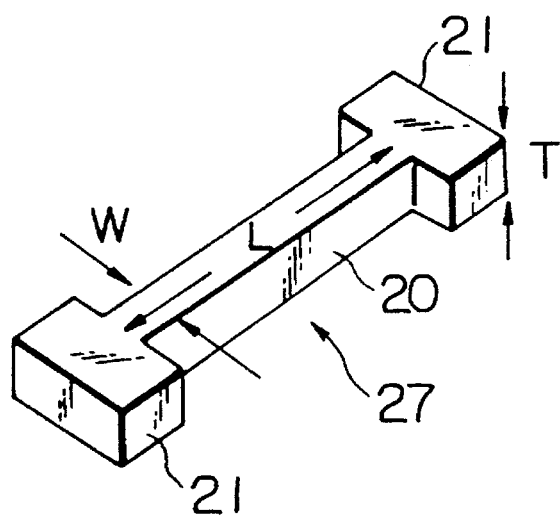
Figure 3:
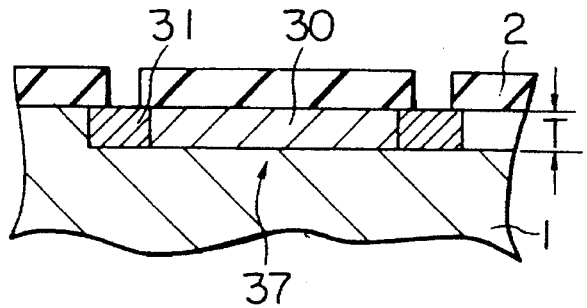
FIGS. 3 and FIG. 4 show a resistance element of other prior art, with FIG. 3 being its cross sectional view and FIG. 4 being its top view.
Figure 4:
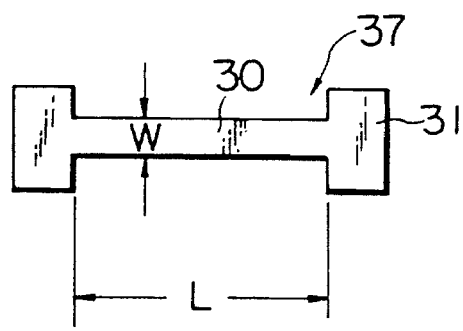
Figure 5:
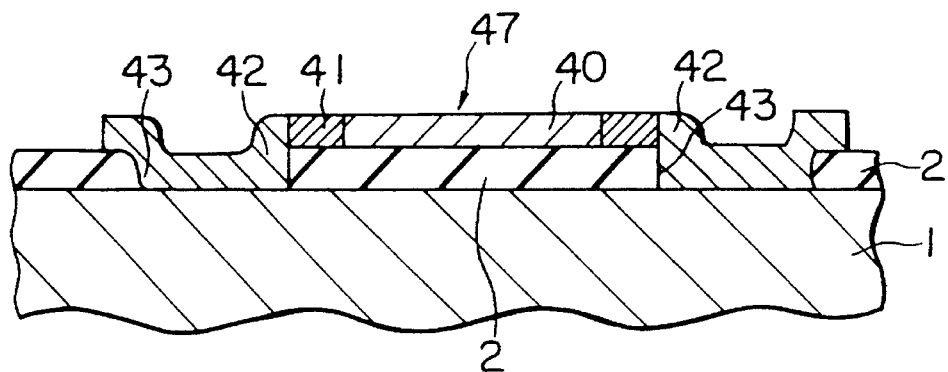
FIG. 5 shows a resistance element of separate prior art.
Figure 6A:
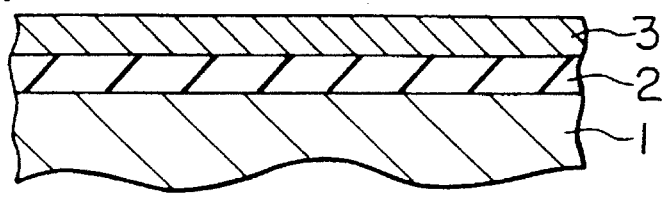
FIGS. 6A to 6E are the cross sectional views in order of manufacturing steps to explain the semiconductor device of the present invention.
Figure 6B:
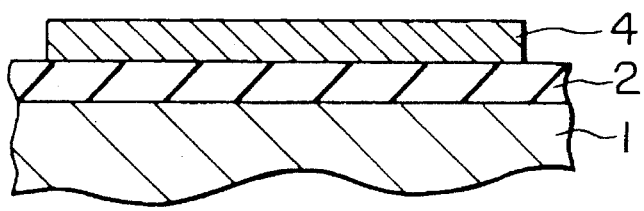
Figure 6C:
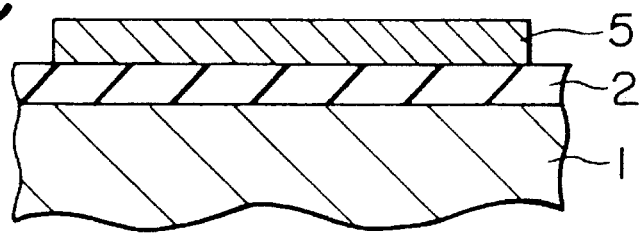
Figure 6D:
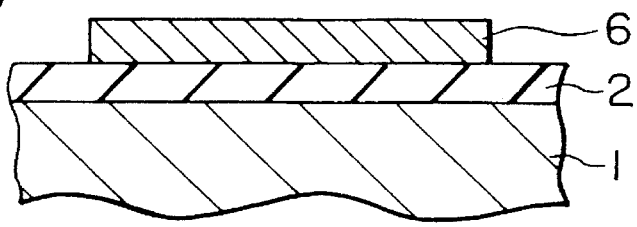
Figure 7A:
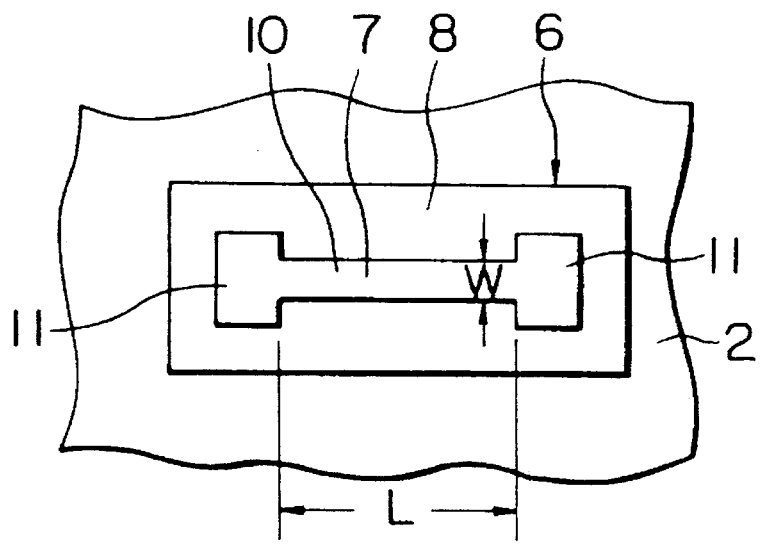
FIGS. 7A and 7B are top views of the semiconductor device showing the states at the process consequent to FIGS. 6A to 6E.
Figure 7B:
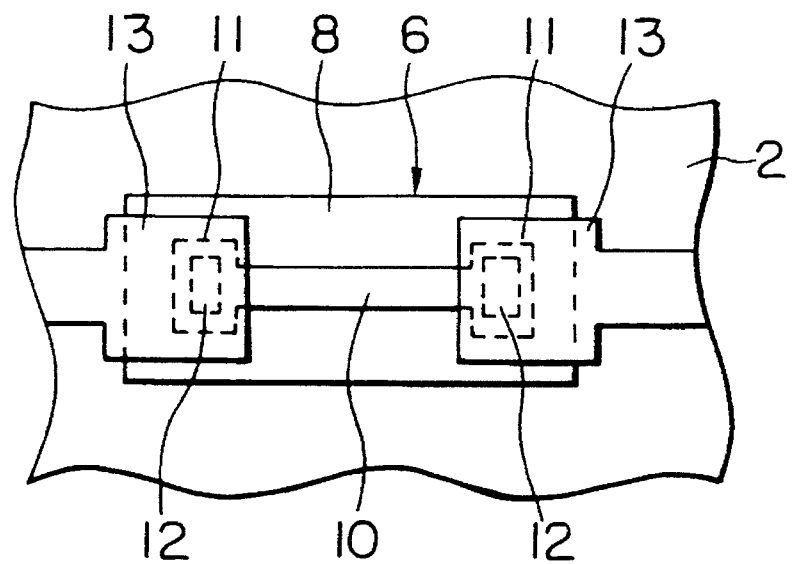

The present invention will be further described referring the drawings as follows;

FIGS. 6A to 6D are cross sectional views of a first embodiment of the present invention and FIGS. 7A to 7B are their top views.

First, as shown in FIG. 6A, an insulation film 2 made of, for example, silicon dioxide is formed on the main surface of the single crystal silicon substrate 1 where other elements are to be formed. An amorphous silicon layer 3 of thickness of 30 nm to 0.5 µm is grown and deposited on the insulation film 2. When this growth is taking place, no impurities, neither P type nor N type, are allowed to be included, therefore, the amorphous silicon layer 3 is a non-doping film. Even if impurities exist for unavoidable reasons, their concentration can be made less than $1\times10^{14}$ atoms.cm$^{-3}$.

Next, as shown in FIG. 6B, the amorphous silicon 3 is formed into the configuration of an amorphous silicon pattern 4 by patterning so that its entire lower surface adheres to the surface of the insulation film 2.

Next, as shown in FIG. 6C, heat treatment is performed., for example, at 600° C. for 12 to 24 hours. Thereby, crystallization takes place at several sites within the amorphous silicon pattern 4, and the amorphous silicon pattern 4 is converted to polycrystalline silicon pattern 5 by utilizing the crystals as seeds. Most portions of the polycrystalline silicon patterns 5 are occupied with large crystals having a diameter of 2 to 5 µm. The smaller crystals only exist at the interface between large crystals. This means that, in the polycrystalline silicon pattern 5, more than half the volume is occupied with the crystal having more than 2 µm diameter.

During the heat treatment for crystallization, a film of the amorphous silicon pattern 4 exists only on the insulation film 2 and the amorphous silicon pattern 4 is not adhered to the single crystal silicon substrate 1, therefore, the state of crystallization becomes uniform in the polycrystalline silicon pattern 5 obtained by heat treatment.

Next, as shown in FIG. 6D, the polycrystalline silicon pattern 5 is patterned to the size required for the distribution design for the elements, and a polycrystalline silicon film 6 of non-doping is positioned only on the insulation film, whose horizontal configuration is island.

Figure 6E:
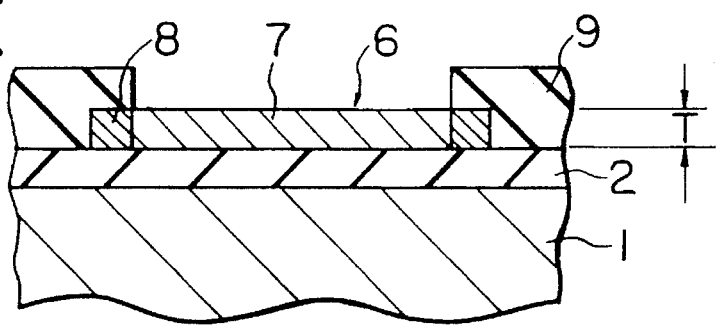

Next, as shown in FIG. 6E, by using photoresist 9 as a mask, impurities such as arsenic and antimony are introduced into the central part 7, except for the peripheral parts 8 of the polycrystalline silicon film 6, by the ion implantation method at a low energy such as 10 keV. As to the mask for ion implantation, instead of the photoresist 9, another method whereby an opening is formed on the other film and a side wall is formed so as to mask the peripheral region 8 of the polycrystalline silicon film 6 can also be used.

Next, after removing the photoresist 9, heat treatment is performed to activate the impurities. For this heat treatment, low temperature-short time rapid thermal annealing (RTA) or low temperature furnace annealing is preferred. Because polycrystalline silicon, more than half the composition of which is occupied with crystals having a diameter of more than 2 µm, is used, the variation of the resistance values and the variance of the resistance values due to the activation heat treatment are negligibly small.

With this process, as shown in FIG. 7A, a resistance element 7 containing impurities at the concentration of, for example, $5\times10^{17}$ atoms.cm$^{-3}$ is formed in the center part of insular shaped polycrystalline film 6. With this, a non-doping region 8 of polycrystalline silicon which essentially does not contain any impurities is formed on the peripheral region except for the central region of the resistance element 7. The non-doping region 8 adheres to all the side of the resistance element 7 in order to radiate the heat generated in the resistance element. The resistance element 7 has a resistor 10 whose resistance value is defined by the length L, width W, height (thickness) T and the concentration of the impurities and contact regions 11 on both sides.

As shown in FIG. 7B, an aluminum wiring 13 is connected with contact region 11 through a contact opening 12 formed on the inter layer insulation film (not shown in the Figure). Because three sides of the contact region 11 are insulating non-doping polycrystalline silicon region 8, the contact opening 12 having larger area than the contact region 11 can be formed on the region ranging from the contact region 11 to polycrystalline silicon region 8.

Figure 8A:
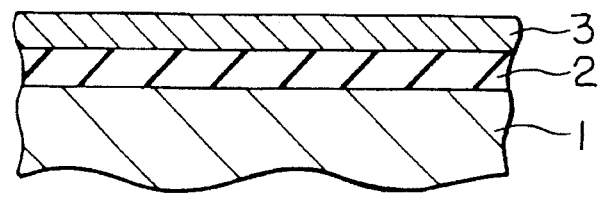
FIGS. 8A to 8C are drawings to explain the other embodiment of the semiconductor device of the present invention, the manufacturing method of which is made up by modifying a part of the process shown in FIGS. 6A to 6C.
Figure 8B:
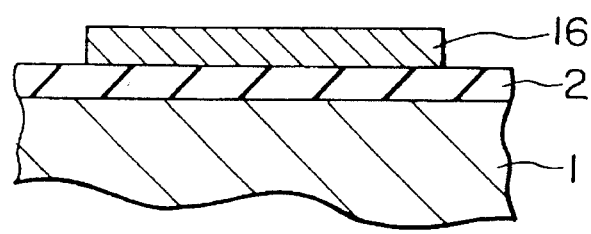
Figure 8C:
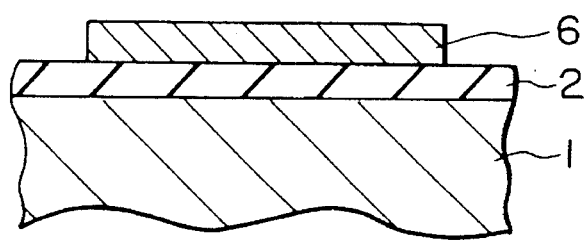

FIGS. 8A to 8C are cross sectional views depicting another embodiment of the present invention, in which a part of the process shown in FIGS. 6A to 6E is modified. The difference of this embodiment from the one shown in FIGS. 6A to 6E and FIGS. 7A and 7B is that, as shown in FIG. 8B, an amorphous silicon film 16 is formed by patterning the non-doping amorphous silicon layer 3 into the final configuration, and a polycrystalline silicon film 6 of the final configuration is formed by subjecting the amorphous silicon film 16 to heat treatment. If the final configuration of the polycrystalline silicon film 6 has already been established, one step can be eliminated by this process.

As another embodiment of the modification, though not illustrated in the Figure, without performing the process in FIG. 6D following the process in FIG. 6C, after forming the resistance element 7 which contains impurities through the processes in FIGS. 6D and 7A, then the polycrystalline silicon film 6 may be formed by performing a patterning process in FIG. 6D so as to make the outer configuration of the non-doping polycrystalline .silicon region 8 around the resistance element 7.

The process in the embodiment enables alteration of the distribution layout including the other elements even after the formation of the resistance element.

Figure 9:
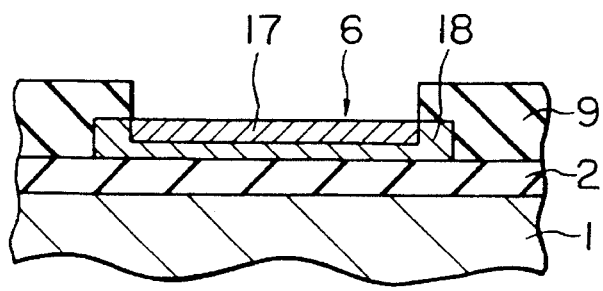
FIG. 9 is a cross sectional view of the semiconductor device which shows the Example Where the depth of introduction of impurities is modified.

In the embodiments shown in FIGS. 6A to 6B and 7A and 7B, the resistance element 7 is formed by introducing impurities in the entire thickness (T) of the polycrystalline silicon film 6 (refer FIG. 6E). However, as shown in FIG. 9, it is also possible to position the non-doping region 18 in the bottom part of the peripheral and central region of the polycrystalline film by forming the resistance element 17 having the impurities contained in the upper part of the peripheral and central region of the polycrystalline silicon film 6. With this structure, a higher resistance value can be obtained if the other conditions are the same, and the heat generated at the resistor can be radiated not only through its sides but also through its bottom face making the radiation very efficient.

Furthermore, because the above described manufacturing method calls for conversion of amorphous silicon to polycrystalline silicon by heat treatment, the variance of the resistance value between before and after heat treatment can be ignored. Also, because the crystallization by heat treatment is not performed by using the surface portion as the seed after having amorphous silicon adhered to the surface of the single crystal silicon substrate, and because the crystallization is performed by heat treatment after having the amorphous silicon pattern placed only on the insulation film, the state of crystallization of the entirety of the pattern becomes uniform and also, because it does not depend on the surface part of the single crystal substrate, it makes the degree of integration on to the substrate high.

What is claimed is:

1. A semiconductor device comprising:

a semiconductor substrate;

an insulation layer formed on the main surface of said substrate;

a polycrystalline silicon layer formed with its entire lower surface overlapping an upper surface of said insulation layer, said polycrystalline layer having a composition at least half of which includes crystals having a grain size at least one of equal to and greater than 2 µm;

a resistance element formed by ion implantation with a predetermined impurity and by a subsequent heat treatment at a central part of said polycrystalline silicon layer; and a polycrystalline silicon region formed substantially undoped with impurity, said polycrystalline silicon region being formed on all sides of said resistance element, and positioned on a peripheral region of said polycrystalline silicon layer, except for said central part thereof.

2. A semiconductor device according to claim 1, wherein the concentration of the impurities on said polycrystalline silicon region is less than $1 \times 10^{14}$ atoms.cm$^{-3}$.

3. A semiconductor device according to claim 1, wherein more than half the composition of said polycrystalline silicon layer includes crystals having a diameter of more than 2 µm.

4. A semiconductor device according to claim 1, wherein said resistance element comprises a resistor having a resistance value defined by dimensions, impurity concentrations and first and second contact regions of said resistance element.

\* \* \* \* \*